US008188381B2

(12) United States Patent
Chan

(10) Patent No.: US 8,188,381 B2
(45) Date of Patent: May 29, 2012

(54) MID-BOARD MODULE RETENTION AND EMI CAGE

(75) Inventor: Seng-Kum Chan, Santa Clara, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 23 days.

(21) Appl. No.: 12/774,784

(22) Filed: May 6, 2010

(65) Prior Publication Data

US 2011/0272188 A1 Nov. 10, 2011

(51) Int. Cl.
*H05K 9/00* (2006.01)

(52) U.S. Cl. .............. 174/382; 361/818; 439/607.14; 439/607.36; 439/607.2

(58) Field of Classification Search .......... 439/607.14, 439/607.15, 607.19, 607.36, 607.2; 174/373, 174/382; 361/818
See application file for complete search history.

(56) References Cited

U.S. PATENT DOCUMENTS

| 5,014,160 | A   | * | 5/1991  | McCoy, Jr. ............... 361/818 |
| 6,377,475 | B1  |   | 4/2002  | Reis |
| 6,552,261 | B2  |   | 4/2003  | Shlahtichman et al. |
| 7,259,969 | B2  | * | 8/2007  | Zarganis et al. .......... 361/800 |
| 7,491,899 | B2  |   | 2/2009  | Zuehlsdorf et al. |
| 7,597,590 | B2  |   | 10/2009 | McColloch |
| 2008/0220650 | A1 | * | 9/2008 | Wu ............................ 439/607 |

FOREIGN PATENT DOCUMENTS

EP          1898687 A1     3/2008

* cited by examiner

*Primary Examiner* — Hung Ngo

(57) ABSTRACT

A module retention and electromagnetic interference (EMI) cage has a substantially flat, rectangular metal frame with retaining clip portions and EMI-shielding contact fingers. The frame has surface-mount legs to facilitate surface mounting the cage to the circuit board. An array connector is mounted on the circuit board within a central region of the cage. An electronic module can be inserted or plugged into the cage in conjunction with connecting the module to the array connector. As the module is inserted into the cage, the module resiliently deflects the EMI-shielding contact fingers. At approximately the same time as the connector of the electronic module mates with the array connector, the retaining clip portion mates with a portion of the housing to retain the module in this position.

20 Claims, 4 Drawing Sheets

MID-BOARD MODULE RETENTION AND EMI CAGE

BACKGROUND

In an optical communication system, it is generally necessary to couple an optical fiber to an opto-electronic transmitter, receiver or transceiver device and, in turn, to couple the device to an electronic system such as a switching system or processing system. These connections can be facilitated by modularizing the transceiver device. An opto-electronic transceiver module includes an opto-electronic light source, such as a laser, and an opto-electronic light receiver, such as a photodiode, and may also include various electronic circuitry associated with the laser and photodiode. For example, driver circuitry can be included for driving the laser in response to electronic signals received from the electronic system. Likewise, receiver circuitry can be included for processing the signals produced by the photodiode and providing output signals to the electronic system.

The electronic system can be provided with connectors or receptacles into which opto-electronic modules can be plugged. In some types of systems, receptacles are located on a front panel of the system enclosure or rack. In such systems, electrical connectors in the receptacles may be mounted on the edge of a circuit board inside the enclosure. In other types of systems, the receptacles or connectors are mounted on the surface of a circuit board. Such a connector arrangement may be referred to as a "mid-plane" or "mid-board" connector arrangement. Opto-electronic modules that can be mid-board mounted commonly include a generally block-shaped housing in which lasers, photodiodes and associated electronic circuitry are enclosed, and a connector that can be plugged into or otherwise mated with a connector mounted on the surface of the circuit board. An optical cable comprising one or more optical fibers may pass through the upper portion of the housing or be attached to a connector on the upper portion the housing and be optically coupled to the lasers and photodiodes. Some opto-electronic modules of this type include an array of multiple lasers and photodiodes. The connector on the bottom of such an opto-electronic module can include an array of electrical contacts. Grasping the housing, a person can press the module down onto a mating connector that is mounted on the surface of the circuit board until the connector on the bottom of the module is mated with the corresponding connector on the circuit board. When mated or connected in this manner, multiple electrical signals can be passed in parallel between the opto-electronic module and the circuit board.

One challenge in developing a mid-board opto-electronic module of the type described above has been retaining the module in the mated position. Some modules include holes through which mounting screws can be passed to screw the module down against the circuit board.

Another challenge in developing opto-electronic modules has been providing adequate shielding against electromagnetic interference (EMI). The signals that pass through the mated connectors between the module and the circuit board are susceptible to EMI. In an edge-mounted module arrangement, the front panel opening or receptacle in the system enclosure or rack into which the module is plugged can in some instances be shielded by, for example, providing EMI-shielding contact fingers around the periphery of the opening. However, providing adequate yet economical EMI shielding for a mid-board opto-electronic module can be more challenging.

SUMMARY

Embodiments of the present invention relate to a module retention and electromagnetic interference (EMI) cage. The cage comprises a substantially flat, rectangular metal frame having sides that are substantially perpendicular to a plane that defines the substantially flat shape of the frame. When mounted around an array connector on a circuit board, the sides of the frame form a perimeter around the array connector. The frame has surface-mount legs that extend away from the sides to facilitate surface mounting the cage to the circuit board. At least one of the sides has a retaining clip portion, although in an exemplary embodiment two opposing sides have such retaining clip portions. At least two of the sides, and in an exemplary embodiment, all four of the sides, have EMI-shielding contact fingers.

An electronic module, which can be of an essentially conventional type, can be inserted or plugged into the central region of the cage in conjunction with connecting the module to the array connector on the circuit board. As the module is inserted further into the cage, the array connector on the circuit board mates with a corresponding connector in the base of the module. At approximately the same time as these connectors mate, a portion of the electronic module mates with the retaining clip portions of the frame. Also, as the module is inserted further into the cage, the module contacts and resiliently deflects the EMI-shielding contact fingers. Once the module is connected in this manner, the retaining clip portions promote retaining the module in an electrically and mechanically connected state with the array connector on the circuit board, and the contact between the EMI-shielding contact fingers and the module promotes shielding of the electrical connections against EMI.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

As illustrated in FIGS. 1-4, in an illustrative or exemplary embodiment of the invention, a module retention and electromagnetic interference (EMI) cage ("cage") 10 is surface-mounted on a circuit board 12. Cage 10 retains and provides EMI shielding for an opto-electronic module 14 that is removably retained in cage 10. Cage 10 is defined by a rectangular (e.g., square) frame comprising four sides 16, 18, 20 and 22. The frame that defines cage 10 can be economically formed from a single piece of sheet metal by bending and cutting it to form the elements described herein. Accordingly, in the exemplary embodiment all of the elements described herein, such as sides 16, 18, 20 and 22 and features thereof, are part of the same, unitary frame.

Figure 1:
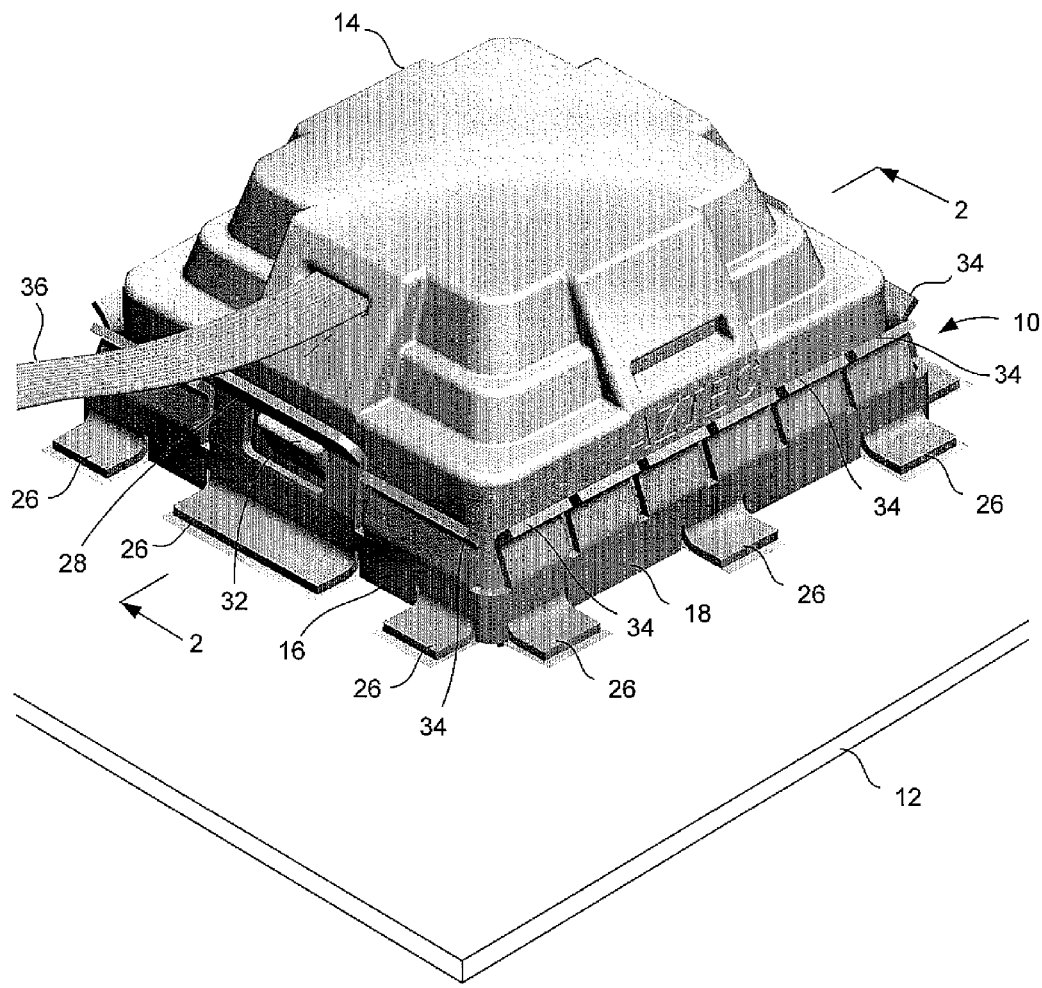
FIG. 1 is a perspective view of a module retention and electromagnetic interference (EMI) cage mounted on a circuit board, showing an opto-electronic module plugged into the cage, in accordance with an exemplary embodiment of the invention.
Figure 2:
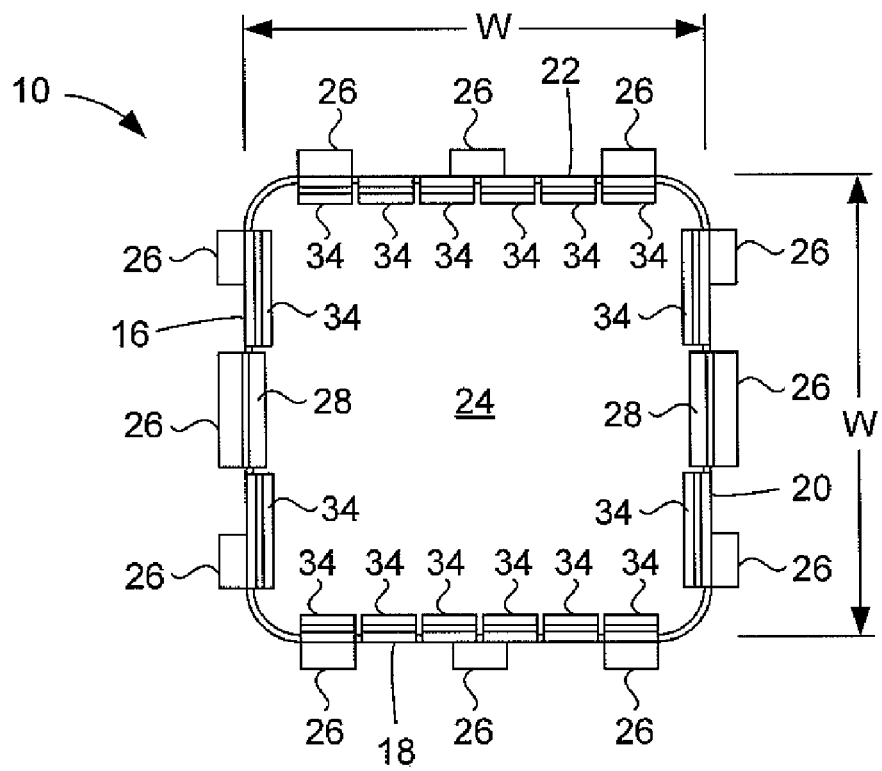
FIG. 2 is a top plan view of the cage of FIG. 1.
Figure 3:
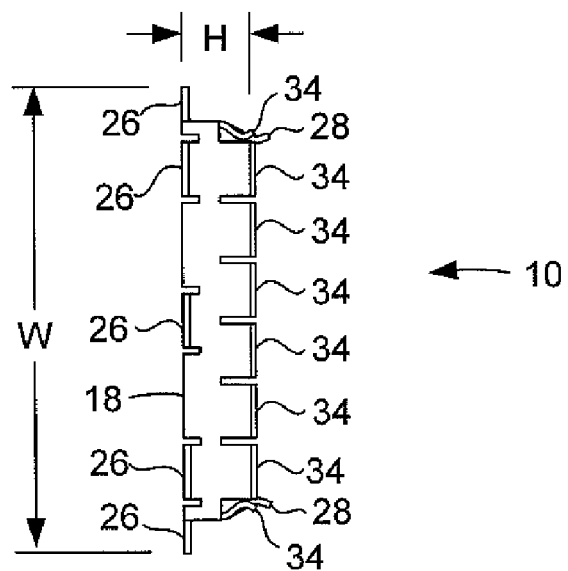
FIG. 3 is side elevation view of the cage of FIGS. 1-2.
Figure 4:
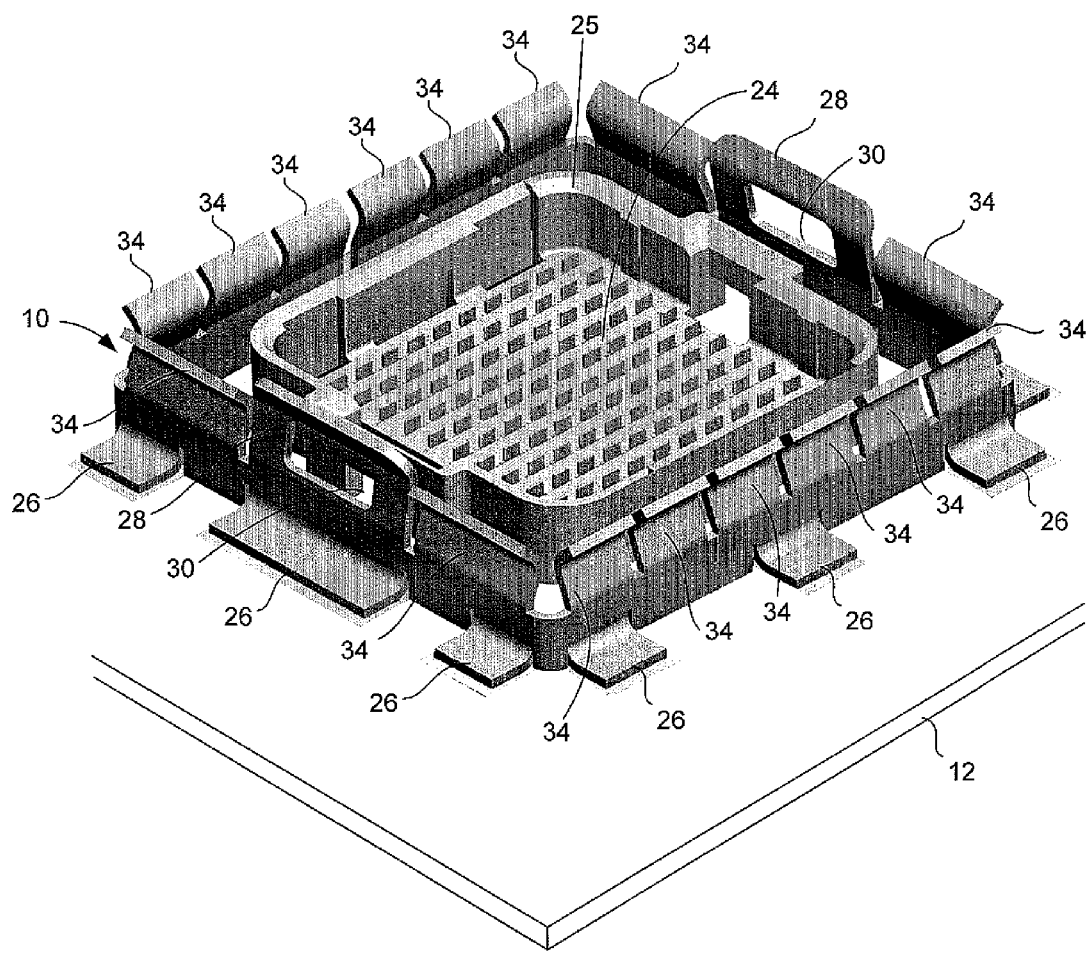
FIG. 4 is a perspective view similar to FIG. 1 but without the module plugged into the cage.

As illustrated in FIGS. 2-3, sides 16, 18, 20 and 22 are low in height ("H") relative to the width ("W") between opposing sides 16 and 20 and between opposing sides 18 and 22, thereby providing cage 10 with a relatively flat, tablet-like or planar shape. When mounted on (planar) circuit board 12, the plane of cage 10 is parallel to the plane of circuit board 12. When mounted on circuit board 12 (FIGS. 1 and 4), the bottoms of sides 16, 18, 20 and 22 are immediately adjacent the surface of circuit board 12, and sides 16, 18, 20 and 22 extend vertically upward toward their tops, i.e., in a direction away from circuit board 12 and perpendicularly to the plane that defines the substantially flat shape of cage 10. The substantially flat shape of cage 10 is the result of the height H being substantially less than the width W. The height H can be less than about, for example, one-fourth the width W. Such a height-to-width aspect ratio of, for example, less than about 1:4, provides a low-profile appearance and facilitates handling by automated pick-and-place machines and other assembly processes (not shown) for surface mounting cage 10 on circuit board 12.

Cage 10 has a central region 24 (FIG. 2) bounded by a perimeter defined by sides 16, 18, 20 and 22. An array connector 25 (FIG. 4), which is also mounted on circuit board 12, is disposed in central region 24. That is, cage 10 is mounted on circuit board 12 around array connector 22. Array connector 25 can be essentially conventional and of any suitable type.

Each of sides 16, 18, 20 and 22 has a number of mounting legs 26 that extend away from the perimeter of the frame (i.e., away from central region 24). For example, sides 18 and 22 can each have six mounting legs, and sides 16 and 20 can each have three mounting legs 26. However, in other embodiments, each side can have any suitable number of mounting legs. Preferably, each side has at least one mounting leg. Mounting legs 26 can be surface-mounted on circuit board 12 using conventional surface-mount soldering techniques or other surface-mount techniques. That is, mounting legs 26 provide a surface-mounting means for mounting cage 10 on circuit board 12. Note that mounting legs 26 are parallel to the plane defining the flat shape of cage 10 and thus parallel to the surface of circuit board 12.

Each of opposing sides 16 and 20 includes a tab-like retaining clip portion 28 that mates with a portion of module 14 (FIG. 1) when module 14 is mated with array connector 25. Although other retaining clip types are possible, in the exemplary embodiment each retaining clip portion 28 has a tab-like shape and an opening 30 that mates with a protrusion 32 on module 14. But for protrusion 32 and other features, such as shape, that facilitate module 14 being received in cage 10, module 14 can be of any suitable conventional type. Thus, such a retaining clip provides a means for retaining module 14 in cage 10.

At the tops of sides 16, 18, 20 and 22 are a number of EMI-shielding contact fingers 34. For example, sides 16 and 20 can each have two contact fingers 34, and sides 18 and 22 can each have six contact fingers 34. Note that in the exemplary embodiment sides 16 and 20 have fewer mounting EMI-shielding contact fingers than sides 18 and 22 because sides 16 and 20 also include retaining clip portions 28. However, in other embodiments, each side can have any suitable number of EMI-shielding contact fingers 34. Preferably, each side has at least two EMI-shielding contact fingers. Thus, EMI-shielding contact fingers 34 provide a means for providing electrical contact between module 14 and the sides of cage 10.

Figure 5:
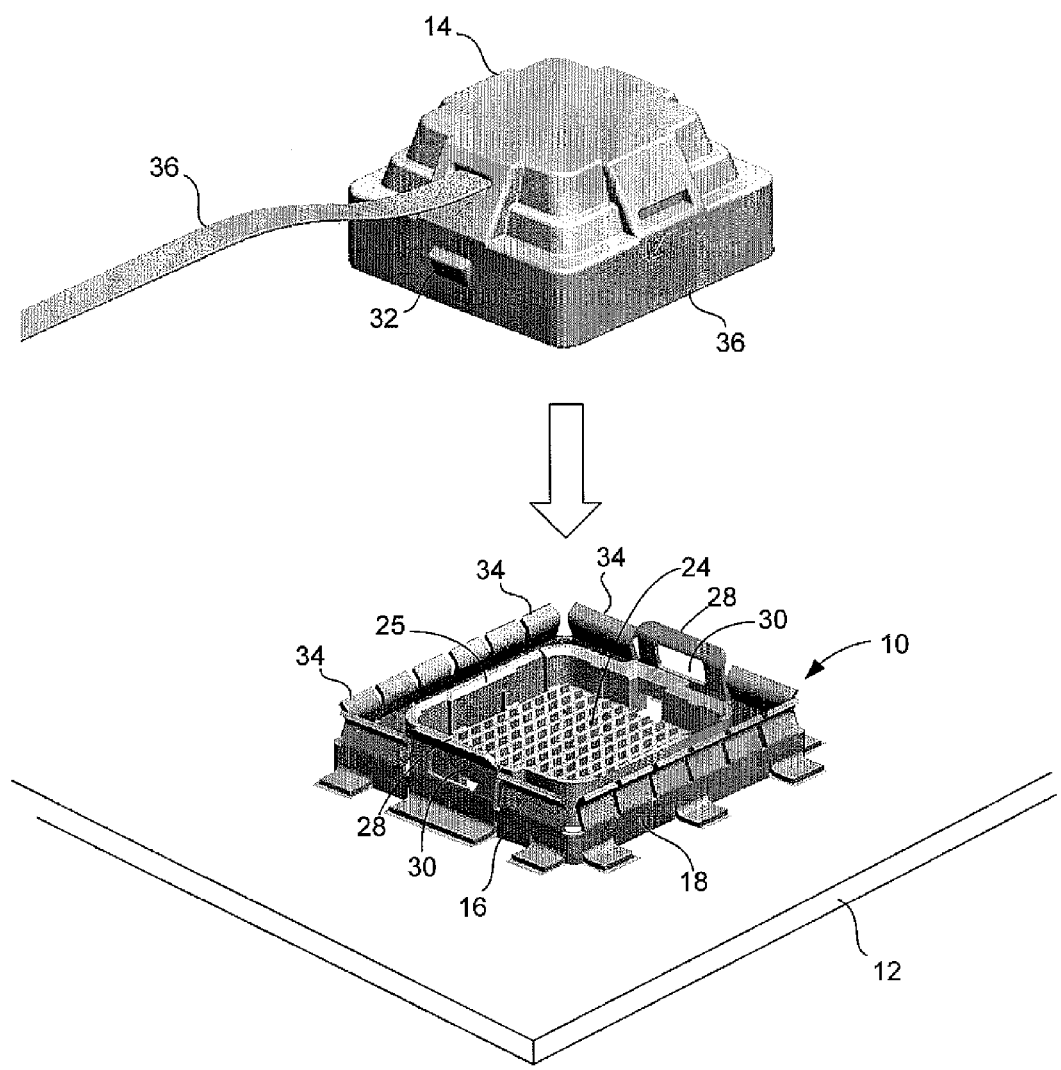
FIG. 5 is a perspective view similar to FIGS. 1 and 4, illustrating a method of plugging the module into the cage, in accordance with the exemplary embodiment.

As illustrated in FIG. 5, cage 10 can be used by plugging module 14 into array connector 25. First, module 14 is aligned over central region 24 of cage 10 in alignment with array connector 25. As module 14 is lowered (indicated by the arrow in FIG. 5), its base portion 36 makes contact with EMI-shielding contact fingers 34 at the tops of sides 16, 18, 20 and 22. The tops of distal ends of EMI-shielding contact fingers 34 are slightly bowed or angled away, i.e., outwardly, from central region 24 to facilitate smooth reception of module 14 into central region 24. The contact points on EMI-shielding contact fingers 34 that are closest to central region 24 as a result of the bowed or angled shape make contact first with module 14. This contact between base portion 36 of module 14 and EMI-shielding contact fingers 34 counteracts the resilient force exerted by EMI-shielding contact fingers 34 to flex or deflect them outwardly as module 14 is urged further downward into cage 10. The downward movement of module 14 as a result of the plugging force exerted on it results in a wiping action between the contact points on EMI-shielding contact fingers 34 and the edges of module 14. That is, the angled or bowed distal ends of EMI-shielding contact fingers 34 provide a means for providing the wiping action. The downward force causes base portion 36 of module 14 to reach array connector 25 and thus mate module 14 to array connector 25. Although not shown for purposes of clarity, base portion 36 of module 14 has an array of electrical contacts that correspond to the mating electrical contacts of array connector 25. The manner in which such conventional electrical connectors can be mated and unmated is well understood in the art and therefore not described herein.

At approximately the same time as module 14 mates to array connector 25, retaining clip portions 28 engage module 14 to retain module 14 in cage 10. In the exemplary embodiment, this retention of module 14 is achieved when protrusions 32 on module 14 counteract the resilient force exerted by retaining clip portions 28 and flex or deflect retaining clip portions 28 outwardly until protrusions 32 snap into openings 30 in retaining clip portions 28.

Once the module reaches the above-described state, module 14 is retained in cage 10, and the electrical connections are shielded by cage 10 against EMI. More specifically, in this state, the connector (not shown) in base portion 36 of module 14 is mated to array connector 25, thereby providing electrical connections between module 14 and circuit board 12. Module 14 can be used in the conventional manner to transmit and receive optical signals via the optical cable 36. Also, in this state, retaining clip portions 28 promote retaining module 14 in an electrically and mechanically connected state with array connector 25. In addition, in this state, the contact between the EMI-shielding contact fingers 34 and module 14 promotes shielding of the electrical connections against EMI. The resilient force exerted by EMI-shielding contact fingers 34 against module 14 in this state maintains good electrical contact between EMI-shielding contact fingers 34 and module 14 (the housing of which is electrically conductive) to promote this shielding effect. The wiping action between the contact points on EMI-shielding contact fingers 34 and module 14 during insertion of module 14 also promotes good electrical contact.

Although not shown for purposes of clarity, to remove module 14, a user can apply a force to spread retaining clip portions 28 outwardly until protrusions 32 on module 14 disengage from openings 30 sufficiently for module 14 to be removed. Module 14 can be removed by pulling it upwardly in the direction opposite that indicated by the arrow in FIG. 5. Pulling module 14 upwardly breaks contact between the electrical contacts of module 14 and the mating contacts of array connector 25. As module 14 is pulled clear of EMI-shielding contact fingers 34, the resilient force causes EMI-shielding contact fingers 34 to return to their unflexed or undeflected state.

One or more illustrative embodiments of the invention have been described above. However, it is to be understood that the invention is defined by the appended claims and is not limited to the specific embodiments described.

What is claimed is:

1. A module retention and electromagnetic interference (EMI) cage system, comprising:
    an array connector mounted on a surface of a circuit board;
    an EMI cage mounted on the circuit board, the EMI cage comprising a substantially flat, rectangular metal frame having a first side, a second side, a third side opposite the first side, and a fourth side opposite the second side, each of the first, second, third and fourth sides substantially perpendicular to a plane defining the substantially flat shape of the frame, the array connector disposed within a central region bounded by a perimeter defined by the first, second, third and fourth sides, at least one of the sides having a retaining clip portion, at least two of the first, second, third and fourth sides each having one or more mounting legs extending away from the perimeter parallel to the plane and mounted on the surface of the circuit board, and at least two of the first, second, third and fourth sides each having an EMI skirt comprising three or more closely spaced resiliently deflectable EMI-shielding contact fingers; and
    an opto-electronic transceiver module pluggably coupled to the array connector by a mating connector on the opto-electronic transceiver module, wherein the EMI skirt of the EMI cage forms an EMI seal around a periphery of the opto-electronic transceiver module, and the retaining clip portion of the EMI cage engages a portion of the opto-electronic transceiver module.

2. The module retention and EMI cage claimed in claim 1, wherein the frame is unitarily formed from a single piece of sheet metal.

3. The module retention and EMI cage claimed in claim 1, wherein each of the first and third sides includes a retaining clip portion.

4. The module retention and EMI cage claimed in claim 3, wherein the retaining clip portion comprises a resiliently deflectable tab having an opening, the opening engageable with a protrusion on a surface of the electronic module.

5. The module retention and EMI cage claimed in claim 1, wherein each of the first, second, third and fourth sides includes a plurality of the resiliently deflectable EMI-shielding contact fingers.

6. The module retention and EMI cage claimed in claim 1, wherein each of the EMI-shielding contact fingers has a distal end outwardly angled away from the central region.

7. The module retention and EMI cage claimed in claim 1, wherein each of the first, second, third and fourth sides has a top and a bottom defining a height of the frame, wherein the height of the frame is less than about one-fourth of a distance between two opposite ones of the first, second, third and fourth sides, whereby the substantially flat shape of the frame is provided by a ratio between the height of the frame and the distance between two opposite sides of the frame.

8. The module retention and EMI cage claimed in claim 1, wherein:
    each of the first and third sides includes a retaining clip portion;
    each of the first and third sides includes a plurality of the resiliently deflectable EMI-shielding contact fingers with the retaining clip portion therebetween; and
    each of the second and fourth sides includes a plurality of the resiliently deflectable EMI-shielding contact fingers and does not include a retaining clip portion.

9. A method for using a module retention and electromagnetic interference (EMI) cage, the cage surface-mounted around an array connector mounted on a circuit board, the cage comprising a substantially planar, rectangular metal frame having a first side, a second side, a third side opposite the first side, and a fourth side opposite the second side, each of the first, second, third and fourth sides substantially perpendicular to a plane defining the substantially planar shape of the frame, at least two of the sides each having an EMI skirt comprising three or more closely spaced EMI-shielding contact fingers, the method comprising:
    plugging an opto-electronic transceiver module into a central region of the frame by inserting the electronic module until a portion of the opto-electronic transceiver module mates with a retaining clip portion of one of the sides, the opto-electronic transceiver module mates with the array connector, and the EMI skirt forms an EMI seal around a periphery of the opto-electronic transceiver module.

10. The method claimed in claim 9, wherein inserting the electronic module comprises a retaining clip portion in each of the first and third sides engaging the electronic module to retain the module in the cage.

11. The method claimed in claim 10, wherein each retaining clip portion comprises a resiliently deflectable tab having an opening, and inserting the electronic module comprises the opening engaging a protrusion on a surface of the electronic module.

12. The method claimed in claim 9, wherein inserting the electronic module comprises outwardly angled distal ends of a plurality of the EMI-shielding contact fingers wiping a plurality of sides of the electronic module.

13. A module retention and electromagnetic interference (EMI) cage system, comprising:
    an array connector mounted on a surface of a circuit board;
    an EMI cage mounted on the circuit board, the EMI cage comprising a substantially flat, rectangular metal frame having a first side, a second side, a third side opposite the first side, and a fourth side opposite the second side, each of the first, second, third and fourth sides substantially perpendicular to a plane defining the substantially flat shape of the frame, the array connector disposed within a central region bounded by a perimeter defined by the first, second, third and fourth sides, at least one of the sides having a means for retaining an electronic module, at least two of the first, second, third and fourth sides each having means for mounting the frame to the surface of the circuit board, and at least two of the first, second, third and fourth sides each having a means for providing an EMI seal; and
    an opto-electronic transceiver module pluggably coupled to the array connector by a mating connector on the opto-electronic transceiver module, wherein the means for providing an EMI seal provides an EMI seal around a periphery of the opto-electronic transceiver module, and the means for retaining an electronic module engages a portion of the opto-electronic transceiver module.

14. The module retention and EMI cage claimed in claim 13, wherein the frame is unitarily formed from a single piece of sheet metal.

15. The module retention and EMI cage claimed in claim 13, wherein the means for retaining the electronic module comprises a retaining clip portion on each of the first and third sides.

16. The module retention and EMI cage claimed in claim 15, wherein the retaining clip portion comprises a resiliently deflectable tab having an opening, the opening engageable with a protrusion on a surface of the electronic module.

17. The module retention and EMI cage claimed in claim 13, wherein the means for providing an EMI seal comprises a plurality of resiliently deflectable EMI-shielding contact fingers on each of the first, second, third and fourth sides.

18. The module retention and EMI cage claimed in claim 17, wherein each of the EMI-shielding contact fingers includes means for providing a wiping action.

19. The module retention and EMI cage claimed in claim 13, wherein each of the first, second, third and fourth sides has a top and a bottom defining a height of the frame, wherein the height of the frame is less than about one-fourth of a distance between two opposite ones of the first, second, third and fourth sides, whereby the substantially flat shape of the frame is provided by a ratio between the height of the frame and the distance between two opposite sides of the frame.

20. The module retention and EMI cage claimed in claim 13, wherein:
- each of the first and third sides includes a retaining clip portion;
- each of the first and third sides includes a plurality of resiliently deflectable EMI-shielding contact fingers with the retaining clip portion therebetween; and
- each of the second and fourth sides includes a plurality of the resiliently deflectable EMI-shielding contact fingers and does not include a retaining clip portion.

* * * * *